(12) United States Patent
Dernovsek et al.

(10) Patent No.: US 8,314,535 B2
(45) Date of Patent: Nov. 20, 2012

(54) PIEZOELECTRIC MULTILAYER COMPONENT

(75) Inventors: Oliver Dernovsek, Graz (AT); Alexander Glazunov, Deutschlandsberg (AT)

(73) Assignee: EPCOS AG, Munich (DE)

( * ) Notice: Subject to any disclaimer, the term of this patent is extended or adjusted under 35 U.S.C. 154(b) by 0 days.

(21) Appl. No.: 12/839,597

(22) Filed: Jul. 20, 2010

(65) Prior Publication Data

US 2010/0320876 A1 Dec. 23, 2010

Related U.S. Application Data

(63) Continuation of application No. PCT/EP2009/000394, filed on Jan. 22, 2009.

(30) Foreign Application Priority Data

Jan. 23, 2008 (DE) .......................... 10 2008 005 682

(51) Int. Cl.
*H01L 41/047* (2006.01)

(52) U.S. Cl. ........................................ 310/364; 310/365

(58) Field of Classification Search .................. 310/328, 310/364–366
See application file for complete search history.

(56) References Cited

U.S. PATENT DOCUMENTS

| | | | |
|---|---|---|---|
| 6,798,123 B2 | 9/2004 | Bindig et al. | |
| 6,891,109 B2 | 5/2005 | Nishide et al. | |
| 7,358,655 B2 | 4/2008 | Ragossnig et al. | |
| 7,420,319 B2 | 9/2008 | Kastl et al. | |
| 7,449,077 B2 | 11/2008 | Heinzmann et al. | |
| 2002/0166694 A1 | 11/2002 | Nishide et al. | |
| 2006/0055288 A1 | 3/2006 | Heinzmann et al. | |
| 2006/0066178 A1 | 3/2006 | Lindner et al. | |
| 2006/0181178 A1 | 8/2006 | Kastl et al. | |
| 2006/0238073 A1 | 10/2006 | Ragossnig et al. | |
| 2006/0254693 A1 | 11/2006 | Murosawa et al. | |
| 2008/0218028 A1* | 9/2008 | Dollgast et al. ............... | 310/328 |
| 2009/0015109 A1 | 1/2009 | Schuh | |
| 2009/0162706 A1 | 6/2009 | Okamura et al. | |
| 2009/0220765 A1 | 9/2009 | Okamura et al. | |
| 2009/0289527 A1 | 11/2009 | Hirschler et al. | |
| 2009/0295256 A1 | 12/2009 | Okamura et al. | |
| 2010/0237751 A1 | 9/2010 | Bosch et al. | |

FOREIGN PATENT DOCUMENTS

| | | |
|---|---|---|
| DE | 102 34 787 C1 | 10/2003 |
| DE | 103 07 825 A1 | 9/2004 |
| DE | 10 2004 031 402 A1 | 2/2006 |
| DE | 10 2004 031 404 A1 | 2/2006 |
| DE | 10 2005 015 112 A1 | 10/2006 |
| DE | 10 2006 031 085 A1 | 9/2007 |
| EP | 1 717 829 A2 | 11/2006 |
| EP | 1 764 844 A1 | 3/2007 |
| EP | 1 898 476 A1 | 3/2008 |
| EP | 1 998 383 A1 | 12/2008 |

(Continued)

*Primary Examiner* — Derek Rosenau
(74) *Attorney, Agent, or Firm* — Slater & Matsil, L.L.P.

(57) ABSTRACT

A piezoelectric multilayer component has a stack of green piezoceramic layers arranged one on top of the other. A first electrode layer is applied onto a piezoceramic layer and contains a first metal. A structured sacrificial layer is applied onto a further piezoceramic layer, adjacent to the first electrode layer in the stacking direction, and contains a higher concentration of the first metal than does the first electrode layer. When the intermediate product is sintered, the first metal diffuses from the structured sacrificial layer to the first electrode layer and in the process leaves cavities which form a weak layer.

23 Claims, 4 Drawing Sheets

FOREIGN PATENT DOCUMENTS

| | | |
|---|---|---|
| EP | 2 003 706 A1 | 12/2008 |
| JP | 2008-124276 A | 5/2008 |
| JP | 2008-270738 A | 11/2008 |
| JP | 2009-054711 A | 3/2009 |
| JP | 2009-231612 A | 10/2009 |
| JP | 2010-034269 A | 2/2010 |
| WO | WO 2006/135013 A1 | 12/2006 |
| WO | WO 2007/097460 A1 | 8/2007 |
| WO | WO 2007/102369 A1 | 9/2007 |
| WO | WO 2010/024277 A1 | 3/2010 |

* cited by examiner

Fig. 4
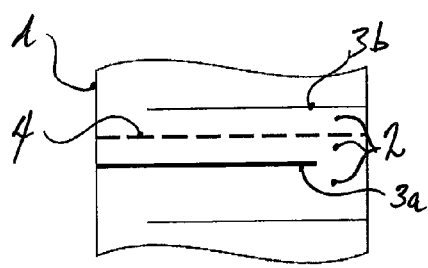
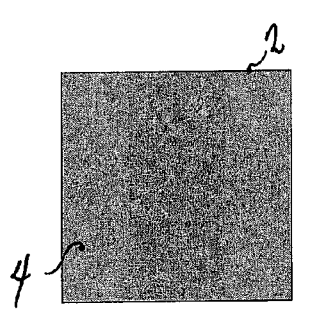
Fig. 5a
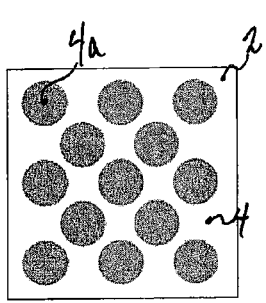
Fig. 5b
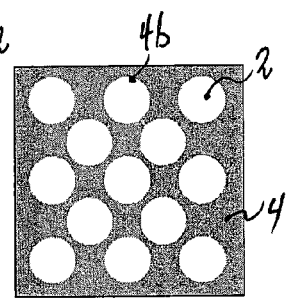
Fig. 5c
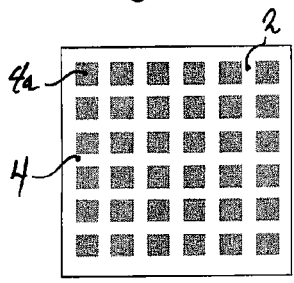
Fig. 5d
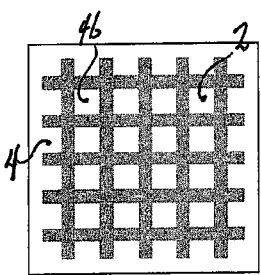
Fig. 5e
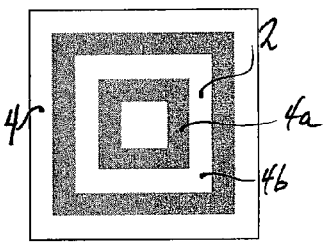
Fig. 5f
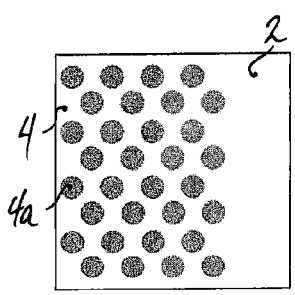
Fig. 6a
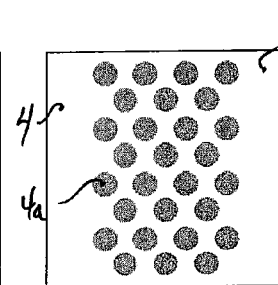
Fig. 6b
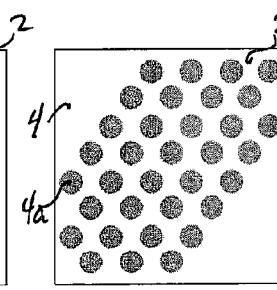
Fig. 6c
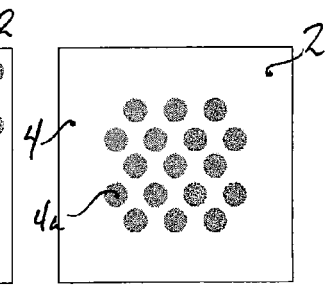
Fig. 6d

PIEZOELECTRIC MULTILAYER COMPONENT

This application is a continuation of co-pending International Application No. PCT/EP2009/000394, filed Jan. 22, 2009, which designated the United States and was not published in English, and which claims priority to German Application No. 10 2008 005 682.0 filed Jan. 23, 2008, both of which applications are incorporated herein by reference.

TECHNICAL FIELD

A method is specified for producing a piezoelectric multilayer component, as well as a piezoelectric multilayer component which can be produced using the method and has an area of reduced mechanical robustness.

BACKGROUND

German patent document DE 10 2006 031 085 A1 and counterpart U.S. Publication 2009/0289527, discloses a piezoelectric multilayer component having weak layers.

SUMMARY

In one aspect, the present invention specifies a piezoelectric multilayer component that can be operated in a stable form over as long a time period as possible.

A piezoelectric multilayer component is specified as an intermediate product, which has a stack of green piezoceramic layers which are arranged one on top of the other. A first electrode layer is applied onto a piezoceramic layer and contains a first metal. A sacrificial layer is applied onto a further piezoceramic layer, adjacent to the first electrode layer in the stacking direction, and contains a higher concentration of the first metal than does the first electrode layer. The term "concentration" in this case refers to the proportion by weight of the metal in the respective electrode layer.

If the intermediate product is sintered, the first metal diffuses from the sacrificial layer to the first electrode layer and in the process leaves cavities, thus forming a weak layer. Therefore, the sacrificial layer is a metallic layer which cannot function as an electrode layer during operation because of its loss of material during the sintering process or even because of its structuring, and which can therefore be referred to as a "sacrificial" layer. The ratio between the concentration of the first metal in the sacrificial layer and of the first metal in the first electrode layer is preferably chosen such that the sacrificial layer loses sufficient material in order, in particular, not to be able to make any electrical contact with external contacts which may be present on the outer surfaces of the stack.

The first electrode layer and the sacrificial layer form a paired system, in which a material exchange takes place when the piezoelectric multilayer component is heated.

The sacrificial layer is preferably in the form of a structured sacrificial layer. In this case, it has an interrupted structure, that is to say it covers only a portion of the green piezoceramic layer. The sacrificial layer is, for example, in the form of an arrangement of metallic islands, which are applied onto a piezoceramic layer. The structured sacrificial layer can furthermore have cutouts, in particular such that, as a network structure, it covers only a portion of the green piezoceramic layer.

According to one embodiment, the concentration of the first metal in the first electrode layer may be less than 100%.

In this case, it is preferable for the concentration of the first metal in the first electrode layer to be up to 80%.

It has been found that copper is particularly suitable for use as the first metal since it softens at relatively low temperatures, and protective sintering of the piezoelectric multilayer component is therefore possible, during which the copper binds well to a piezoceramic layer. Furthermore, it has been found that copper, in comparison to other metals such as palladium or platinum, diffuses relatively easily through a piezoceramic, thus making it easier to produce a piezoelectric multilayer component, as described in the following text, with a mechanically weakened area that has cavities.

A different metal, such as silver or nickel, can be used instead of copper as the first metal.

According to one embodiment, the first electrode layer contains an additional, second metal, which is different from the first metal. The second metal is preferably palladium.

It is preferable for the second metal to diffuse less well than the first metal through a piezoceramic layer which is adjacent to the first electrode layer. The diffusion of metal through the multilayer component is therefore achieved predominantly by the first metal, in particular by copper, which has higher mobility through a piezoceramic when heated.

The second metal is preferably selected from palladium, beryllium, aluminum, manganese, zinc, tin, bismuth, nickel, cobalt, chromium, molybdenum, niobium, rubidium, depending on what metal is used as the first metal in the first electrode layer.

It is advantageous for the concentration of the first metal in the first electrode layer to be higher than is the second metal. For example, the concentration of the first metal is 70% and the concentration of the second metal is 30% in the first electrode layer. In order to allow the sacrificial layer to diffuse to the first electrode layer, the concentration of the first metal in the first electrode layer must be lower than the concentration of the first metal in the sacrificial layer. The diffusion of the first metal reduces its concentration difference between the first electrode layer and the sacrificial layer, that is to say the concentration of the first metal in the sacrificial layer decreases.

In addition to the metals, the sacrificial layer may contain an organic binding agent which preferably evaporates as a result of suitable heat treatment even before the sintering of the intermediate product.

According to one embodiment of the intermediate product, a second electrode layer is provided, which is applied onto a further piezoceramic layer, wherein the second electrode layer contains the same first metal as the first electrode layer and the sacrificial layer. In this case, it is advantageous for the second electrode layer to contain at most the same concentration of the first metal as does the sacrificial layer. The aim of this is to as far as possible prevent the first metal from diffusing from the second electrode layer into the sacrificial layer, such that the second electrode layer does not suffer any loss of material, or suffers only an extremely minor loss of material. This ensures that, after the sintering of the intermediate product, the second electrode layer can be functionally used as an electrode layer, that is to say that it is suitable for forming electrical fields.

It is preferable for the piezoceramic layers of the piezoelectric multilayer component to contain a ceramic composed of lead-zirconate-titanate (PZT). It has been found that metals, in particular copper, can diffuse with relatively little resistance through a PZT ceramic during the sintering of the intermediate product. The diffusion process of a metal between two areas of the piezoelectric multilayer component, in which the first metal is present in different concentrations, can thus be promoted.

A green body is furthermore specified as an intermediate product in the production of a piezoelectric multilayer component, wherein green films which are stacked one above the other and contain a piezoelectric ceramic and electrode layers located therebetween are provided, and wherein a sacrificial layer containing metal is arranged adjacent to a first electrode layer, wherein the first electrode layer contains a first metal as a main component with a proportion by weight of more than 50%. In this case, the first electrode layer contains a second metal, which is not the same as the first metal, as a secondary component with a proportion by weight of less than 50%, whereas the sacrificial layer contains the first metal as a main component with a proportion by weight which is greater than the proportion by weight in the first electrode layer.

In addition to the piezoelectric multilayer component as an intermediate product or as a green body, a method is specified for producing a piezoelectric multilayer component as an end product or as a sintered product.

In this case, the piezoelectric multilayer component which is produced as an intermediate product is sintered, wherein the first metal diffuses at least partially from the sacrificial layer to the first electrode layer and in the process leaves cavities in the area which was previously printed with the sacrificial layer, thus mechanically weakening the interface between two piezoceramic layers between which the sacrificial layer was applied.

A piezoelectric multilayer component is also specified which can be produced directly using the production method described here, and in which the intermediate product is processed further.

BRIEF DESCRIPTION OF THE DRAWINGS

The described subjects will be explained in more detail with reference to the following exemplary embodiments and figures, in which:

FIG. 4 shows a section of the stack of a green piezoelectric multilayer component with a structured metallic sacrificial layer;

FIGS. 5a to 5f show various embodiments of a sacrificial layer;

FIGS. 6a to 6d show a section of the stack of a green piezoelectric multilayer component with arrangement options for a structured sacrificial layer, which differ with respect to the cross-sectional area of the stack;

Figure 1:
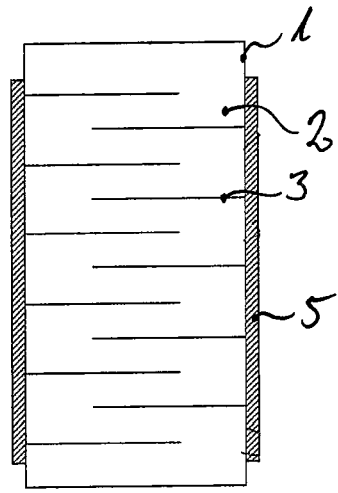
FIG. 1 shows a longitudinal section through a piezoelectric multilayer component.

The following list of reference symbols can be used in conjunction with the drawings:
1 Stack of piezoceramic layers and electrode layers
2 Piezoceramic layer
3 Electrode layer
3a First electrode layer
3b Second electrode layer
4 Sacrificial layer
5 External contact
6 Crack
7 Cavities

DETAILED DESCRIPTION OF ILLUSTRATIVE EMBODIMENTS

FIG. 1 shows a cross section through a schematically illustrated piezoactuator, which has a stack 1 of piezoceramic layers 2 and electrode layers 3 located between them. External contacts are applied as external metallizations 5 to two longitudinal faces of the stack 1 and make contact with those ends of the electrode layers 3 which are led to these longitudinal faces. Adjacent electrode layers of different polarity overlap in an orthogonal projection which runs parallel to the stack axis of the piezoactuator. An electrical field in the overlap area, which is referred to as active zone, leads to a piezoceramic layer 2 which is present between these electrode layers being deflected or stretched. The area in which opposite-pole adjacent electrode layers 3 do not overlap is referred to as an inactive zone. In this area, the piezoelectric effect results in virtually no deflection. The material in the electrode layers 3 is chosen such that they do not melt excessively during the sintering process and such that the structure of the printed-electrode layer remains substantially unchanged during and after the sintering process.

Figure 2:
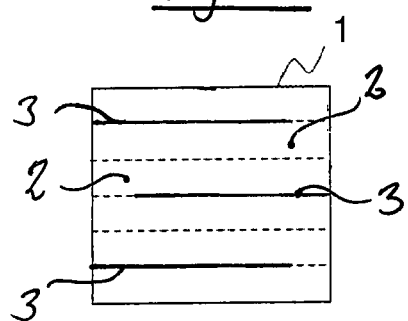
FIG. 2 shows a section of the stack of a piezoelectric multilayer component.

FIG. 2 shows a section of a stack 1 of a piezoactuator in which a plurality of piezoceramic layers 2 can be stacked one on top of the other between opposite-pole, adjacent electrode layers 3. A section such as this is also used as a base for construction for embodiments of a piezoactuator which will be described in the following text, because further electrode layers 3 and sacrificial layers can be applied between the additional piezoceramic layers 2 and can stimulate diffusion processes because of their different material compositions.

Figures 3A, 3B:
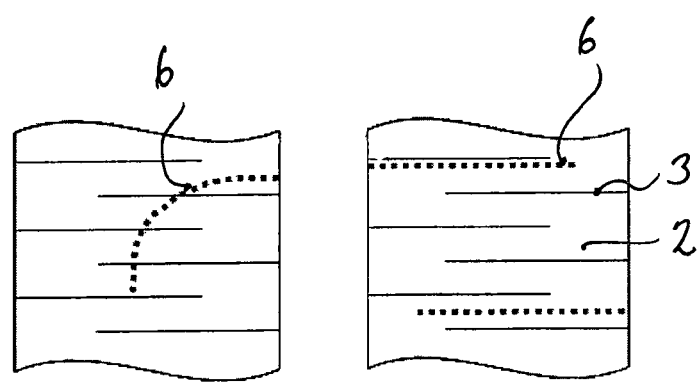
FIGS. 3a and 3b show poling cracks in a piezoelectric multilayer component.

FIG. 3a shows how a crack 6 connects a plurality of electrode layers 3, in particular opposite-pole electrode layers 3 in a piezoactuator.

The inventors have found that the reliability of a piezoactuator is critically dependent on coping with any cracks that occur. During thermal processes, for example, during sintering at temperatures between 800° C. and 1500° C., metallization and soldering and during the polarization of the sintered piezoactuator, the different strain that occurs in the active and inactive zones results in mechanical stresses which lead to so-called strain-relief cracks and/or poling cracks in the piezoactuator. These run along in the inactive zone or in an electrode layer 3. These cracks can bend at the transition to the active area. If these cracks in this case bridge at least two electrode layers, short circuits can occur which can lead to failure of the piezoactuator. Cracks which run parallel to the inner electrodes in contrast represent virtually no risk to the life cycle of piezoactuators.

FIG. 3b shows a safe profile of a crack 6 in the stack 1 of a piezoactuator. In this case, the crack runs substantially parallel to an electrode layer 3 and to a piezoceramic layer 2, as a result of which the crack does not connect opposite-polarity electrode layers, and therefore also does not cause any shorts.

One idea to avoid damaging cracks as shown in FIG. 3a is to use adjacent metallic layers composed of different materials in order to stimulate diffusion processes which are intended to take place as a result of the different compositions of these metallic layers, at higher temperatures during the sintering process. During the diffusion process, a metallic layer or a component of an alloy of this layer should lose more material than the other. In the process, cavities are created in this metallic layer and will lead to mechanical weakening of this layer. Poling cracks or other cracks will therefore preferably occur in the mechanically weakened metallic layer and will propagate only within that layer.

FIG. 4 now shows a longitudinal section through a schematically illustrated section of a stack 1 of a piezoactuator, in which a sacrificial layer 4 is arranged on a piezoceramic layer 2, and in which the sacrificial layer 4 is arranged between a first electrode layer 3a and a second electrode layer 3b, and these electrode layers are adjacent with opposite polarity and in the stacking direction. In this context, adjacent in the stacking direction means that there are no further functional electrode layers between the first electrode layer 3a and the second electrode layer 3b.

By way of example, instead of using exclusively copper, a material with the composition $(1-x)$ Cu/x Pd can be used in a specific number of first electrode layers 3a, with $0<x<1$. This material can either be a mixture of copper powder and palladium powder or an alloy of these two metals. The first electrode layer 3a therefore contains a mixture of copper and palladium, while in contrast the sacrificial layer 4 preferably contains only copper as a metal. As an alternative to this, instead of copper, it is also possible to use a different metal, such as silver. The first electrode layer 3a contains, for example, a mixture or an alloy of silver and palladium. The sacrificial layer 4 preferably contains only silver.

The difference in the composition of the first electrode layer 3a and of the sacrificial layer 4 will stimulate diffusion processes at relatively high temperatures. It has been found that copper has more mobility in piezoelectric ceramics based on PZT than palladium. This leads to the diffusion taking place in only one direction, specifically from the sacrificial layer 4 composed of pure copper into the first electrode layer 3a containing copper and palladium. The first electrode layer 3a, which contains copper and palladium, therefore acts as a copper sink. The material loss in the sacrificial layer 4 in the immediate vicinity of the first copper-palladium electrode layer 3a leads to the formation of cavities, weakening the interface between the previously existing sacrificial layer and the surrounding piezoceramic layers 2. Conditions are therefore created for the formation and propagation of controlled cracks as shown in FIG. 3b, which run substantially within the interface and therefore parallel to piezoceramic layers 2.

The proportion of cavities in the sacrificial layer 4 can be controlled by the composition of the first electrode layers 3a and of the sacrificial layer 4, the thickness of the layers and by three-dimensional structuring of the sacrificial layer 4.

The sacrificial layer 4 is preferably applied as a pattern of metallic islands or as a metal layer with a pattern of cutouts to a piezoceramic layer 2. The metallic area or the metallic areas of a structured sacrificial layer 4 such as this preferably contains or contain only the first metal, in this example copper.

The structured sacrificial layer 4 is preferably applied by screen printing, sputtering or spraying onto the piezoceramic layer.

By way of example, the piezoceramic layers contain a ceramic with a composition according to the following formula:

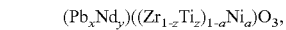

$(Pb_xNd_y)((Zr_{1-z}Ti_z)_{1-a}Ni_a)O_3$, where
 $0.90 \leq x \leq 1.10$;
 $0.0001 \leq y \leq 0.06$;
 $0.35 \leq z \leq 0.60$;
 $0 \leq a \leq 0.10$.

Preferably, 10% of the total number of electrode layers in the piezoactuator contain first electrode layers 3a, that is to say they contain a lower concentration of the first metal than in a sacrificial layer 4.

A more detailed description of one preferred composition of the first electrode layer 3a will now be given. In this case, the proportion by weight of copper is 99.9% to 70%, in particular with a proportion of 97% to 75%, in the first electrode layer 3a. The rest of the first electrode layer contains palladium as a metal, wherein organic binding agents which may be used here are not included. In this case, either an alloy of copper and palladium or a mixture of copper powder and palladium powder is used.

Copper particles in the first electrode layer 3a and/or in the sacrificial layer 4 have a diameter of 0.1 to 10 μm, preferably 0.4 to 1.5 μm.

Palladium particles in the first electrode layer 3a likewise have diameters of 0.1 to 10 μm, preferably 0.4 to 1.5 μm. Other metal particles, for example, silver particles, may likewise have these sizes.

The particle sizes in an alloy in the first electrode layer 3a, that is to say in a compound of various metals which are not present separately in the form of different powders, can likewise have the dimensions mentioned above.

The first electrode layer 3a is preferably also applied by screen printing, sputtering or spraying onto a piezoceramic layer 2. The same printing process as that used to produce the sacrificial layer 4 can advantageously be used in this case.

The thickness of a first electrode layer 3a in the unsintered state of the piezoactuator is preferably between 0.1 and 20 μm, preferably 1.0 and 10 μm.

The proportion of first electrode layers 3a may amount to between 1% and 100% of the total number of electrode layers in the piezoelectric multilayer component. In one preferred embodiment, the proportion of the first electrode layers 3a is in the range between 5% and 15%. At least one sacrificial layer 4 is preferably located alongside each first electrode layer 3a.

FIG. 5a shows a plan view of a sacrificial layer 4 which covers the entire surface of a piezoceramic layer 2. Cavities are produced by the loss of material from this sacrificial layer 4 during sintering. If the material composition of the sacrificial layer is chosen appropriately, virtually the entire amount of the first metal can diffuse to the first electrode layer during sintering. However, during this process, the adjacent piezoceramic layers 2 cannot be firmly bonded to one another, thus mechanically weakening the interface between these piezoceramic layers 2, and therefore allowing them to be used as a weak layer during operation of the piezoactuator.

FIG. 5b shows a plan view of a structured sacrificial layer 4 which is in the form of an arrangement of metallic islands 4a, which cover only a portion of the surface of a piezoceramic layer 2. The metallic islands 4a are circular in this case, but may each have any other desired outline, for example, a polygonal outline. The metallic islands 4a are preferably applied onto the piezoceramic layer 2 in a regular pattern, such that they are each at the same distances from one another. A regular structure such as this is, however, not a requirement.

FIG. 5c shows a plan view of a structured, metallic sacrificial layer 4 with cutouts or holes 4b, as a result of which the layer 4 covers only a portion of the surface of a piezoceramic layer 2. The printed structure is a negative image of the structure in the previous image. The holes 4b are preferably circular and are at regular distances from one another. That area of the piezoceramic layer which is printed with the metallic sacrificial layer 4 can extend to the edge of the piezoceramic layer 2. Since the printed-on first metal migrates later during the sintering of the green stack, however, a cavity remains at the edge area of the piezoceramic layer 2, as a result of which external metallizations applied onto the outside of the stack no longer have any electrical contact in the inner area of the stack 1 on the level of the migrated first metal.

FIG. 5d shows an embodiment of the structured metallic sacrificial layer 4 in which the metallic islands 4a are square.

FIG. 5e shows a metallic sacrificial layer 4 which is applied as a network structure to a piezoceramic layer 2. The first metal is therefore applied onto the piezoceramic layer 2 in a cohesive structure which includes square cutouts 4b. In contrast to the structure shown in FIG. 5c, the cutouts 4b in this case are square instead of circular, and the metallic area does not extend to the edge of the stack 1.

FIG. 5f shows a metallic sacrificial layer 4 which is applied onto a piezoceramic layer 2 as an arrangement of concentric metallic areas in the form of frames. The metallic areas may in this case have circular or square outlines. They may be considered to be metallic islands in the form of frames, which have a common center. This embodiment can be regarded as a combination of metallic islands 4a as shown in FIG. 5b and cutouts 4b as shown in FIGS. 5c and 5e.

FIGS. 6a to 6d illustrate various positions of an arrangement of metallic islands 4a on a surface of a piezoceramic layer 2. By way of example, a first arrangement of metallic islands, which has a substantially rectangular outline, can extend with one side of this rectangular outline as far as a longitudinal face of the stack 1 (FIG. 6a), but with an opposite side of the outline of the island arrangement being at a distance from the opposite longitudinal face of the stack. Instead of this, opposite sides of a rectangular outline of an arrangement of metallic islands can also extend to two mutually opposite longitudinal faces of the stack, and can be set back with respect to the further longitudinal faces (FIG. 6b). Additionally or alternatively, the arrangement of metallic islands may have an outline in the form of a parallelogram, such that two corners of this outline extend to two corners of the stack (FIG. 6c). Alternatively, the arrangement of metallic islands may be located only in the inner area of the surface of a piezoceramic layer, such that no part of the outline of the arrangement extends to a longitudinal face of the stack (FIG. 6d).

FIGS. 7a to 7d show the longitudinal section through a section of a stack 1 of a piezoactuator having various arrangement options of first electrode layers 3a and sacrificial layers 4, which are each surrounded by second electrode layers 3b in the stacking direction. The combinations of first electrode layers 3a and sacrificial layers 4 shown here may be present as often as required in the stack and need not be surrounded by second electrode layers 3b.

Figures 7A, 7B, 7C, 7D:
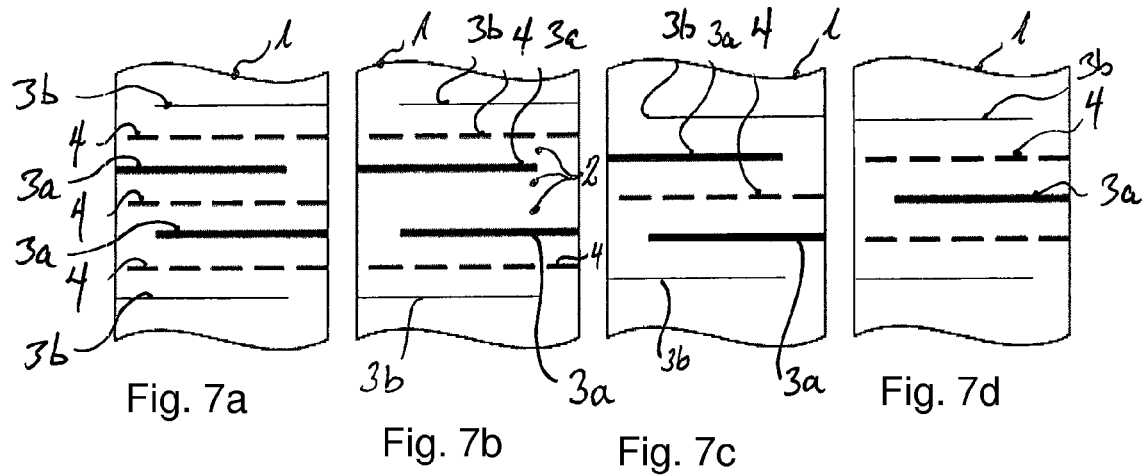
FIGS. 7a to 7d show a section of the stack of a green piezoelectric multilayer component with arrangement options for one or more sacrificial layers which differ with respect to the stacking direction.

FIG. 7a shows an arrangement in which a first electrode layer 3a, which contains a first metal in a lower concentration than the first metal in a sacrificial layer 4, is arranged between two sacrificial layers 4 which are adjacent in the stacking direction and can each have a structure as shown in one of FIGS. 5a to 6d. In this case, two first electrode layers 3a are adjacent in the stacking direction. Each first electrode layer 3a is surrounded by two sacrificial layers 4 in the stacking direction. An "inner" sacrificial layer is adjacent to two first electrode layers 3a in the stacking direction. Two "outer" sacrificial layers are each adjacent to one first electrode layer 3a and to one second electrode layer 3b, whose metal component is preferably formed entirely from the first metal. By way of example, the arrangement such as this of a sacrificial layer, first electrode layer, sacrificial layer, first electrode layer and sacrificial layer continues in the stacking direction.

In this case, the first electrode layer 3a preferably contains a mixture of a first metal, for example, copper, and of a second metal, for example, palladium. The copper in the two sacrificial layers 4 between which a first electrode layer 3a is arranged can diffuse to this first electrode layer, and leave cavities in the process. The first electrode layer 3a is therefore used as a sink for the first metal from two sacrificial layers.

FIG. 7b shows an exemplary embodiment in which a sacrificial layer 4 with the first metal is positioned between a first electrode layer 3a and a second electrode layer 3b. However, with respect to the stacking direction of the stack 1, the first electrode layer 3a or the second electrode layer 3b can be located above or below the sacrificial layer 4. Arrangements of groups of three such as these can be separated from one another by means of a plurality of piezoceramic layers 2. In the exemplary embodiment illustrated here, there are always two piezoceramic layers between two functional electrode layers.

FIG. 7c shows a sacrificial layer 4 arranged between two opposite-polarity first electrode layers 3a which are adjacent in the stacking direction. In this case, two first electrode layers 3a therefore "share" a sacrificial layer. During sintering of the piezoactuator, the first metal from the sacrificial layer 4 can therefore at the same time diffuse into two adjacent first electrode layers 3a. In this case as well, the first electrode layers 3a preferably contain a second metal, which can diffuse only poorly through a piezoceramic, such as palladium.

In FIG. 7d, first electrode layers 3a and second electrode layers 3b alternate regularly in the stacking direction, with each of the first electrode layers 3a being surrounded by two sacrificial layers 4.

Figure 8:
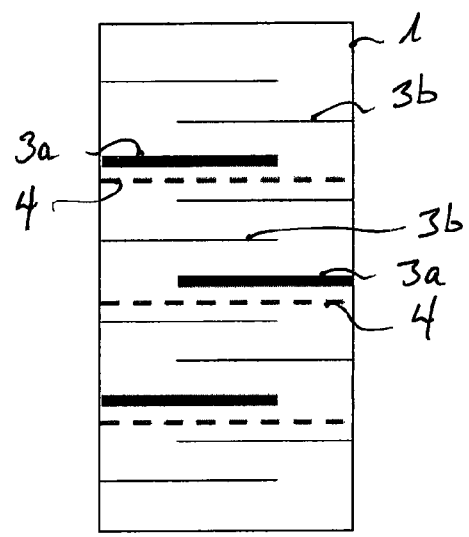
FIG. 8 shows a section of the stack of a green piezoelectric multilayer component with a repeating arrangement of first electrode layers, sacrificial layers and second electrode layers.

FIG. 8 shows a section of a stack 1 of a green piezoelectric multilayer component in which a pair comprising a first electrode layer 3a and a sacrificial layer 4 are present at regular intervals in the stack. The other electrode layers are second electrode layers 3b. Any desired number of second electrode layers 3b can be replaced by pairs of first electrode layers 3a and sacrificial layers 4. For example, only one single pair such as this can be provided in a stack. However, each electrode layer can also be formed by a pair comprising a first electrode layer 3a and a sacrificial layer 4.

Figure 9:
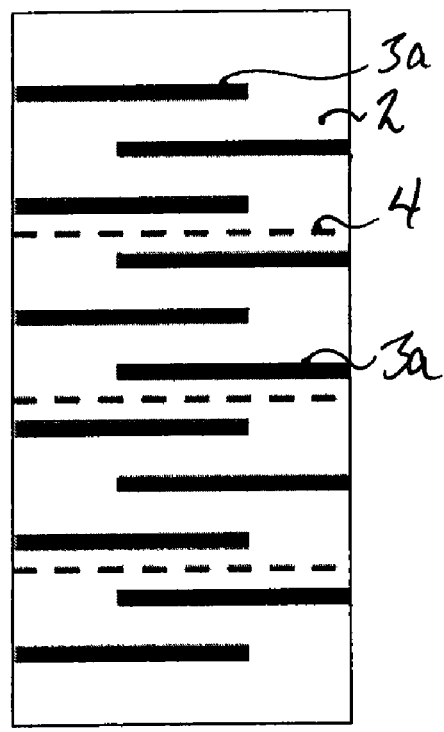
FIG. 9 shows a section of the stack of a green piezoelectric multilayer component with a repeating arrangement of first electrode layers and sacrificial layers.

FIG. 9 shows a section of a stack 1 of a green piezoelectric multilayer component in which only first electrode layers 3a and sacrificial layers 4 are provided, and there are no second electrode layers. A sacrificial layer 4, whose metal component is preferably composed entirely of copper, is arranged between a number of first electrode layers 3a of opposite polarity, the main component of which, for example, is copper, with a secondary component of palladium. In this case, each first electrode layer 3a is not adjacent to a sacrificial layer 4 in the stacking direction. There may be any desired number of sacrificial layers 4 in the stack. For example, only one sacrificial layer 4 may be provided, or else one sacrificial layer 4 can be located adjacent to each first electrode layer 3a.

Figure 10:
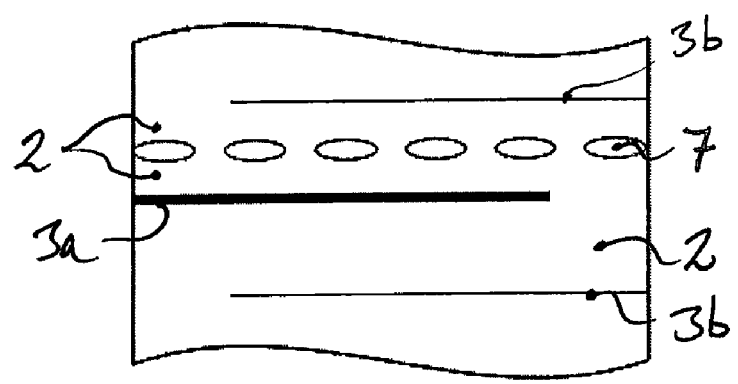
FIG. 10 shows a section of the stack of a sintered piezoelectric multilayer component with an interface, which has cavities, between two piezoceramic layers.

FIG. 10 shows a section of a stack 1 of a sintered piezoelectric multilayer component in which cavities 7 are formed at the interface between two piezoceramic layers 2, wherein the first metal of the sacrificial layer was present before the sintering, at the location of the cavities 7. During sintering, the first metal migrated from the sacrificial layer by diffusion to a first electrode layer 3a with a lower concentration of the first metal. The cavities 7 can be produced deliberately at specific positions in the interface by structuring of the sacrificial layer, for example as shown in FIGS. 5b to 5f and 6a to 6d.

The diffusion process can be achieved on the one hand by suitable selection of the concentration difference between the sacrificial layer 4 and an adjacent first electrode layer 3a with the lower concentration of the first metal.

On the other hand, the diffusion process can be achieved by means of suitable temperature control during sintering, or during heating, of the green stack. FIG. 10 shows existing cavities 7 between a first electrode layer 3a and a second electrode layer 3b. The metal diffused from the sacrificial layer virtually exclusively in the direction of the first electrode layer 3a, since the second electrode layer 3b contains a concentration of the first metal which is equal to or virtually equal to the concentration of the first metal in the sacrificial layer. There was therefore no significant concentration gradient between the sacrificial layer 4 and the second electrode layer 3b which would cause a diffusion process of the first metal between them.

What is claimed is:

1. A piezoelectric multilayer component, comprising:
   a stack of green piezoceramic layers arranged one on top of the other;
   a first electrode layer applied to one of the piezoceramic layers, the first electrode layer containing a first metal;
   a sacrificial layer applied to a further piezoceramic layer, the sacrificial layer being adjacent to the first electrode layer in a stacking direction, wherein the sacrificial layer has a higher concentration of the first metal than does the first electrode layer, wherein the sacrificial layer cannot function as an electrode layer; and
   a second electrode layer applied to a further one of the piezoceramic layers, wherein the second electrode layer contains the first metal in the same concentration as the sacrificial layer.

2. The piezoelectric multilayer component as claimed in claim 1, wherein the sacrificial layer comprises a structured sacrificial layer.

3. The piezoelectric multilayer component as claimed in claim 2, wherein the structured sacrificial layer comprises an arrangement of islands on the piezoceramic layer.

4. The piezoelectric multilayer component as claimed in claim 2, wherein the structured sacrificial layer has cutouts that are free of the first metal.

5. The piezoelectric multilayer component as claimed in claim 1, wherein the first metal is in a concentration of up to 80% in the first electrode layer.

6. The piezoelectric multilayer component as claimed in claim 1, wherein the first metal comprises copper.

7. The piezoelectric multilayer component as claimed in claim 1, wherein the first electrode layer also contains a second metal that is different than the first metal.

8. The piezoelectric multilayer component as claimed in claim 7, wherein the second metal cannot diffuse as well as the first metal through a piezoceramic layer that is adjacent to the first electrode layer.

9. The piezoelectric multilayer component as claimed in claim 7, wherein the second metal comprises a metal selected from the group consisting of palladium, beryllium, aluminum, manganese, zinc, tin, bismuth, nickel, cobalt, chromium, molybdenum, niobium, and rubidium.

10. The piezoelectric multilayer component as claimed in claim 7, wherein the first metal is present in a higher concentration in the first electrode layer than is the second metal.

11. The piezoelectric multilayer component as claimed in claim 1, further comprising a second electrode layer applied to a piezoceramic layer, wherein the second electrode layer contains the first metal.

12. The piezoelectric multilayer component as claimed in claim 11, wherein the second electrode layer contains at most a same concentration of the first metal as does the sacrificial layer.

13. The piezoelectric multilayer component as claimed in claim 1, wherein the first electrode layer is located between ones of the piezoceramic layers, the component further comprising a third electrode layer located between the piezoceramic layers such that the sacrificial layer is arranged between the first electrode layer and third electrode layer, wherein the first and third electrode layers have different polarities.

14. The piezoelectric multilayer component as claimed in claim 1,
    wherein the first and second electrode layers have different polarities.

15. A sintered piezoelectric multilayer component produced by sintering the piezoelectric multilayer component as claimed in claim 1.

16. The piezoelectric multilayer component as claimed in claim 1, wherein the sacrificial layer contains the first metal as a main component.

17. A method for producing a piezoelectric multilayer component, the method comprising:
    providing a stack of green piezoceramic layers arranged one on top of the other;
    applying a first electrode layer to one of the piezoceramic layers, the first electrode layer containing a first metal; and
    applying a sacrificial layer to a further piezoceramic layer, the sacrificial layer being adjacent to the first electrode layer in a stacking direction, wherein the sacrificial layer contains a higher concentration of the first metal than does the first electrode layer;
    wherein the providing, applying a first electrode layer and applying a sacrificial layer form a piezoelectric multilayer component comprising:
        the stack of green piezoceramic layers arranged one on top of the other;
        the first electrode layer applied to the one of the piezoceramic layers, the first electrode layer containing the first metal;
        the sacrificial layer applied to the further piezoceramic layer, the sacrificial layer being adjacent to the first electrode layer in the stacking direction, wherein the sacrificial layer a higher concentration of the first metal than does the first electrode layer and wherein the sacrificial layer cannot function as an electrode layer; and
        a second electrode layer applied to a further one of the piezoceramic layers, wherein the second electrode layer contains the first metal in the same concentration as the sacrificial layer.

18. The method as claimed in claim 17, the method further comprising:
    the method further comprises performing a heating process so that the first metal diffuses at least partially from the sacrificial layer into the first electrode layer thereby leaving cavities at an interface between two piezoceramic layers between which the sacrificial layer was applied.

19. The method as claimed in claim 18, further comprising structuring the sacrificial layer prior to performing the heating process, wherein a location of the cavities is based on a pattern of the structuring.

20. The method as claimed in claim 18, wherein the heating process comprises a sintering process.

21. A method for producing a piezoelectric multilayer component, the method comprising:
   providing an intermediate structure that comprises a stack of green piezoceramic layers arranged one on top of the other, a first electrode layer applied to one of the piezoceramic layers, the first electrode layer containing a first metal, and a sacrificial layer applied to a further piezoceramic layer, the sacrificial layer adjacent to the first electrode layer in a stacking direction, wherein the sacrificial layer contains a higher concentration of the first metal than does the first electrode layer; and
   sintering the intermediate structure so that the first metal diffuses at least partially from the sacrificial layer into the first electrode layer and in the process leaves cavities, thus mechanically weakening an interface between two piezoceramic layers between which the sacrificial layer was applied,
   wherein after sintering the piezoelectric multilayer component comprises:
      the stack of green piezoceramic layers arranged one on top of the other;
      the first electrode layer applied to one of the piezoceramic layers, the first electrode layer containing the first metal;
      the sacrificial layer applied to the further piezoceramic layer, the sacrificial layer being adjacent to the first electrode layer in the stacking direction, wherein the sacrificial layer has a higher concentration of the first metal than does the first electrode layer and wherein the sacrificial layer cannot function as an electrode layer; and
      a second electrode layer applied to a further one of the piezoceramic layers, wherein the second electrode layer contains the first metal in the same concentration as the sacrificial layer.

22. The method as claimed in claim 21, wherein adjacent piezoceramic layers are connected between the cavities during the sintering.

23. A piezoelectric multilayer component produced directly using the method according to claim 21.

* * * * *